(12) United States Patent
Ochiai et al.

(10) Patent No.: US 8,063,748 B2
(45) Date of Patent: Nov. 22, 2011

(54) RADIO IC TAG COMMUNICATION SYSTEM

(75) Inventors: Mari Ochiai, Tokyo (JP); Hideto Aikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 680 days.

(21) Appl. No.: 12/093,146

(22) PCT Filed: Nov. 10, 2006

(86) PCT No.: PCT/JP2006/322470
§ 371 (c)(1),
(2), (4) Date: May 9, 2008

(87) PCT Pub. No.: WO2007/074590
PCT Pub. Date: Jul. 5, 2007

(65) Prior Publication Data
US 2008/0309465 A1 Dec. 18, 2008

(30) Foreign Application Priority Data
Dec. 26, 2005 (JP) .................................. 2005-373032

(51) Int. Cl.
*H04Q 5/22* (2006.01)
*G08B 13/14* (2006.01)
*G06F 11/00* (2006.01)

(52) U.S. Cl. .................. 340/10.51; 340/10.1; 340/10.2; 340/572.1; 340/10.5; 340/10.3; 714/100

(58) Field of Classification Search ................. 340/10.1, 340/10.2, 10.5–10.52, 10.3, 572.1; 714/100
See application file for complete search history.

(56) References Cited

U.S. PATENT DOCUMENTS

| 6,686,829 | B1 | 2/2004 | Hohberger et al. |
| 6,958,678 | B2 | 10/2005 | Hohberger et al. |
| 7,190,257 | B2 * | 3/2007 | Maltseff et al. ............ 340/10.51 |
| 7,315,970 | B2 * | 1/2008 | Arakawa et al. ............... 714/718 |
| 7,475,806 | B1 * | 1/2009 | Crossno et al. ................ 235/375 |
| 2005/0237155 | A1 * | 10/2005 | Hohberger et al. ........... 340/10.1 |

FOREIGN PATENT DOCUMENTS

| JP | 7 49820 | 2/1995 |
| JP | 11 120305 | 4/1999 |
| JP | 2004 29984 | 1/2004 |
| JP | 2005 148924 | 6/2005 |

OTHER PUBLICATIONS

Extended Search Report issued Dec. 15, 2010 in Europe Application No. 06823292.5.

* cited by examiner

*Primary Examiner* — Benjamin C Lee
*Assistant Examiner* — Omeed Alizada
(74) *Attorney, Agent, or Firm* — Oblon, Spivak, McClelland, Maier & Neustadt, L.L.P.

(57) ABSTRACT

A communication system includes a wireless IC tag and a reader/writer that performs reading and writing on the wireless IC tag via wireless communication. The reader/writer includes an error control encoder and an error control decoder. On writing data into the wireless IC tag, the reader/writer encodes the data by the error control encoder and writes real data separately from error-control-decodable data. On reading out data from the wireless IC tag, the reader/writer selects whether to read out only the real data or to read out data including error-control-decodable information to decode the data by the error control decoder based on error control information indicating whether to perform error control or not.

20 Claims, 7 Drawing Sheets

MEMORY REGIONS OF TAG

| REGION WHERE MSB IS "0" | DATA WITHOUT ERROR CONTROL (ONLY REAL DATA) |
|---|---|
| REGION WHERE MSB IS "1" | DATA WITH ERROR CONTROL (ENCODED DATA) |

| TAG DATA, 128 BITS ||||
|---|---|---|---|
| PHYSICAL HEADER, 8 BITS | SERVICE HEADER, 32 BITS | SERVICE DATA, 56 BITS | ECC, 32 BITS |

PRIOR ART

RADIO IC TAG COMMUNICATION SYSTEM

TECHNICAL FIELD

The present invention relates to a wireless IC tag and particularly to a wireless IC tag communication system which can improve reliability in a reading/writing operation of data.

BACKGROUND ART

Wireless IC tag communication system has become widely used for physical distribution, parts management, and inventory management in recent years. In the wireless IC tag communication system, management is realized with a wireless IC tag (RFID tag), which is attached to an article or the like to be managed and in which information such as an identification code of the article or the like to be managed is written, and a reader/writer (interrogator) which reads out the information from the wireless IC tag. A manner to deal with errors caused by distortion generated in a communication channel is not specifically set down in standard of the wireless IC tag itself. Hence, conventionally, data in the wireless IC tags are processed through independent techniques for error control (See Patent Document 1, for example).

FIG. 9 is a diagram illustrating an allocation of memory regions in the wireless IC tag of the above-described system. In the above-described system, an error correcting code is applied to data before the data is written into the wireless IC tag as shown in FIG. 9. In communication between the reader/writer and the wireless IC tag, all of 128 bits shown in FIG. 9 are always employed, and the communication is made only with a reader/writer that has an error correcting function.

Patent Document 1: Japanese Patent Application Laid-Open No. 2004-29984

DISCLOSURE OF INVENTION

Problem to be Solved by the Invention

However, in the above-described conventional system, it is impossible to see whether the data in the wireless IC tag is error-control-coded data or not, and the wireless IC tag can communicate only with the reader/writer equipped with a decoder supporting an Error Control Coding (ECC) applied to the data in the wireless IC tag. When the wireless IC tag is employed for physical distribution management which requires checking of the wireless IC tag at plural points, all the reader/writers employed for the management have to be equipped with an error-control supporting function.

The present invention is made in order to solve problems as described above, and an object of the present invention is to provide a wireless IC tag communication system which realizes management of a wireless IC tag using plural reader/writers even when not all the reader/writers are equipped with an error-control supporting function.

Means for Solving Problem

To solve the problem as described above, a wireless IC tag communication system according to one aspect of the present invention includes a wireless IC tag, and a reader/writer that reads/writes data from/into the wireless IC tag through wireless communication, wherein the reader/writer includes an error control encoder and an error control decoder, and the reader/writer, on writing data into the wireless IC tag, encodes the data by the error control encoder and separately writes real data not subjected to error control coding and data including error-control-decodable information, and, on reading data from the wireless IC tag, selects whether to read out only the real data or to read out the data including the error-control-decodable information to decode the read out data by the error control decoder based on error control information indicating whether to perform error control or not.

Further, a wireless IC tag communication system according to another aspect of the present invention includes a wireless IC tag, a reader/writer that reads/writes data from/into the wireless IC tag through wireless communication, and a computer that processes data read by the reader/writer, wherein the computer includes an error control encoder and an error control decoder, and the computer, on writing data into the wireless IC tag, encodes the data by the error control encoder and separately writes real data not subjected to error control coding and data including error-control-decodable information, and, on reading data from the wireless IC tag, selects whether to read out only the real data or to read out the data including the error-control-decodable information to decode the read out data by the error control decoder based on error control information indicating whether to perform error control or not.

In the above, "error-control decodable information" should be interpreted widely and can be any kinds of information for which error control can be performed. Specifically, "error-control decodable information" is, for example, real data converted in an error correctable manner (error correcting code configured as a non-systematic code), a redundant bit added to real data for error correction of the real data (error correcting code configured as a systematic code), and a redundant bit added to real data for error detection of the real data (error detecting code configured as a systematic code).

Effect of the Invention

According to the wireless IC tag communication system of the present invention, the wireless IC tag management can be realized with plural additional reader/writers even when not all the reader/writers have an error-control supporting function.

Figure 1:
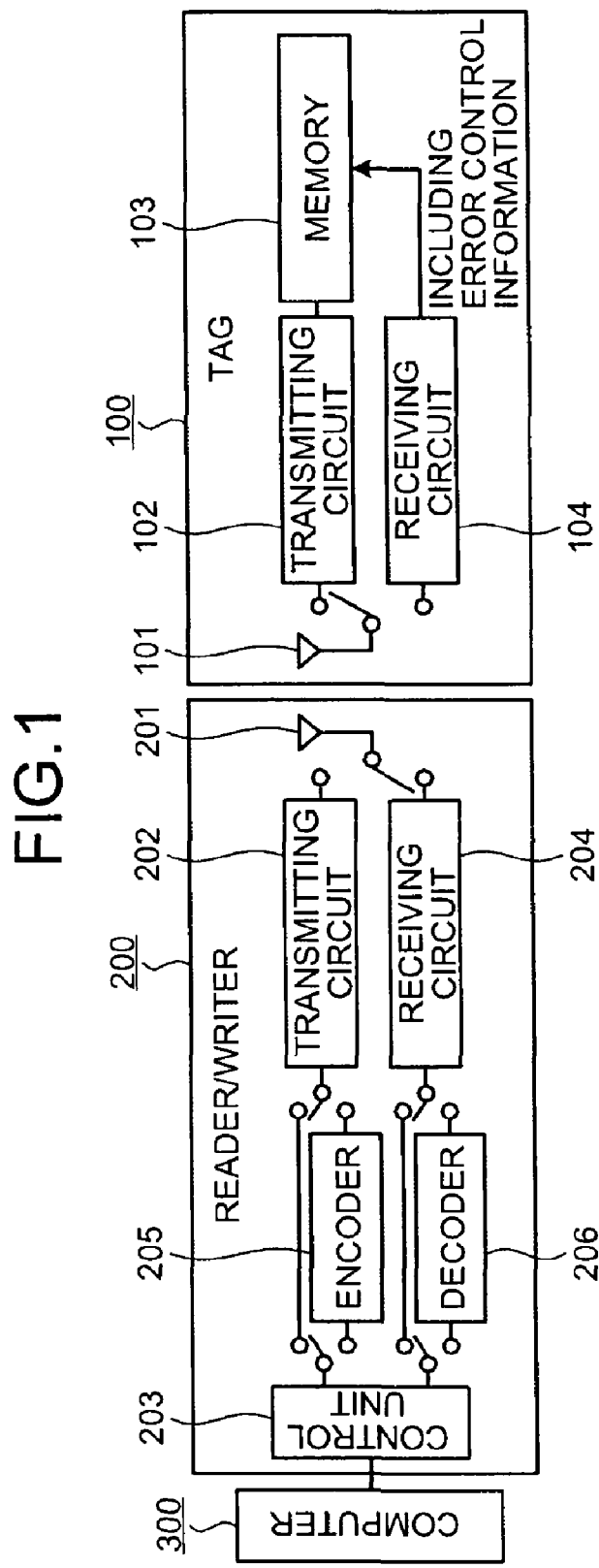
FIG. 1 is a block diagram of a first embodiment of a wireless IC tag communication system according to the present invention.

EXPLANATIONS OF LETTERS OR NUMERALS 100 tag
101 antenna
102 transmitting circuit
103 memory
104 receiving circuit
200, 400 reader/writer
201 antenna
202 transmitting circuit
203 control unit
204 receiving circuit
205, 605 control encoder
206, 606 control decoder
300, 600 computer
500 plant
510 transport company
520 shop
501, 511, 512, 522 reader/writer

BEST MODES FOR CARRYING OUT THE INVENTION

Embodiments of the wireless IC tag communication system according to the present invention will be described below in detail referring to the attached drawings. The present invention is not limited by the embodiments.

First Embodiment

FIG. 1 is a block diagram of a first embodiment of the wireless IC tag communication system according to the present invention. In FIG. 1, the wireless IC tag communication system of the embodiment includes a wireless IC tag 100, a reader/writer 200, and a computer 300. The reader/writer 200 reads out information in the tag 100, and the computer 300 processes the information read out by the reader/writer 200 so as to manage an article to which the wireless IC tag 100 is attached.

Further, the wireless IC tag 100 includes an antenna 101, a transmitting circuit 102, a memory 103, and a receiving circuit 104. Furthermore, the reader/writer 200 includes an antenna 201, a transmitting circuit 202, a control unit 203, a receiving circuit 204, an error control encoder 205, and an error control decoder 206. The control unit 203 controls switching of transmission/reception and switching between use and non-use of the encoder and the decoder. The reader/writer 200 uses the error control encoder 205 at a time of data writing (at Write time) and uses the error control decoder 206 at a time of data reading (at Read time). However, the system can realize communication without using an error-control supporting function, and at such time, the system does not use the error control encoder 205 and the error control decoder 206. Further, the reader/writer 200 may include more than one antenna.

Figure 2:
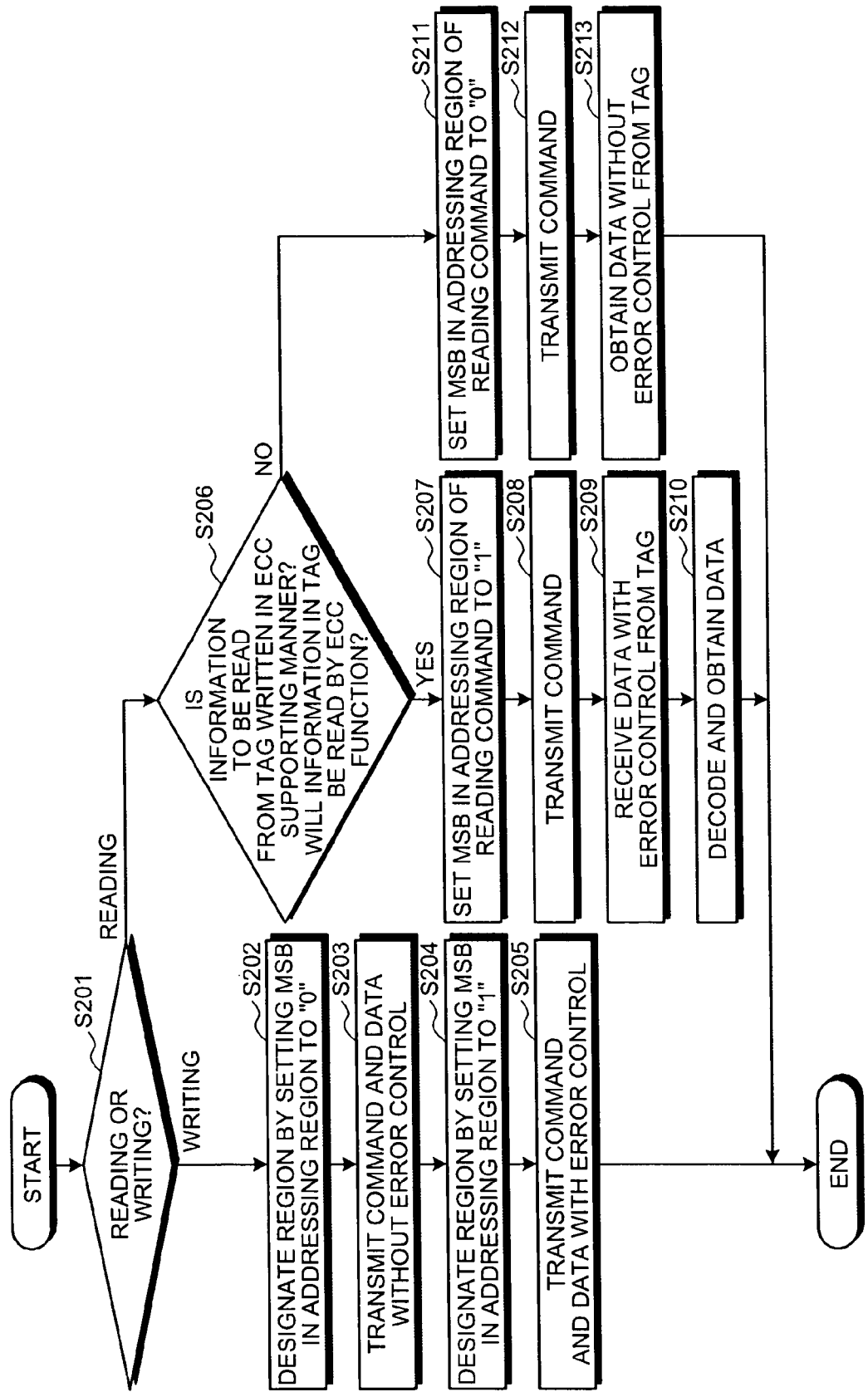
FIG. 2 is a flowchart illustrating a flow of a communication procedure between a reader/writer and a wireless IC tag in the first embodiment.
Figures 3, 4:
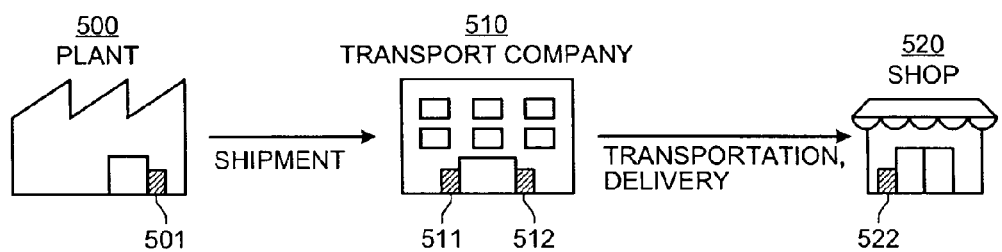
FIG. 3 is a diagram illustrating an allocation of memory regions of the wireless IC tag in the first embodiment.
FIG. 4 is a diagram illustrating physical distribution product management to which the wireless IC tag communication system of the first embodiment is actually applied.

A flow of a communication procedure between the reader/writer 200 and the wireless IC tag 100 is shown in a flowchart of FIG. 2. With regard to an error control function, operation is performed with error control when a most significant bit (MSB) of a data writing region in the wireless IC tag 100 is "1" and without error control when the MSB is "0". At the time of data writing (step S201), the computer 300 writes data without error control (real data) and data with error control (encoded data for error correction of real data) in the memory regions in the wireless IC tag 100 as shown in FIG. 3. To write the data without error control, the MSB in an addressing region is set to "0" to designate a predetermined region and a command and data are generated (Step S202). The command and the data generated in the computer 300 as described above are transmitted through a path selected by switching control of the control unit 203 so as not to pass through the error control encoder 205, and further transmitted through the transmitting circuit 202 and the antenna 201 to the wireless IC tag 100 (step S203). In the wireless IC tag 100, the command and the data received by the antenna 101 are subjected to demodulation in the receiving circuit 104, and the data is stored in the memory 103 in the region designated by the address.

On the other hand, to write the data with error control, the MSB in the addressing region is set to "1" to designate a predetermined region, and a command and data are generated (step S204). The command and data generated in the computer 300 as described above are transmitted through a path selected by switching control of the control unit 203 so as to pass through the error control encoder 205, and further transmitted through the transmitting circuit 202 and the antenna 201 to the wireless IC tag 100 (step S205). In the wireless IC tag 100, the command and the data received by the antenna 101 are subjected to demodulation in the receiving circuit 104, and the data is stored in the memory 103 in the region designated by the address.

When it is determined in advance whether to perform the error control or not for the entire system, since the computer 300 of FIG. 1 can use the error control supporting function (ECC function) at the time of data reading if information to be read in the wireless IC tag is written by the reader/writer 200 supporting the error control (ECC) (step S206), the MSB in an addressing region of a reading command is set to "1" in command generation (step S207) and the command is transmitted through the control unit 203, the encoder 205, the transmitting circuit 202, and the antenna 201 (step S208). Then, the data sent from the wireless IC tag 100 of FIG. 1 as a response is received by the receiving circuit 204 via the antenna 201 (step S209). The decoder 206 decodes the received data using the error control function, and the computer 300 obtains the decoded data (step S210).

If the system does not need to use the error control supporting function, the computer 300 of FIG. 1 can send a command in which the MSB is set to "0" so that the operation without the error-control supporting function is selected. If information to be read in the wireless IC tag 100 is written by a reader/writer without the error-control supporting function, the MSB is set to "0" in command generation (step S211) and the generated command is transmitted to the wireless IC tag 100 (step S212), so that the data transmitted from the wireless IC tag 100 is read without using the error-control supporting function (step S213). When the error-control supporting function is not used, received signals, as they are, are data from the wireless IC tag 100.

On the other hand, when it is not determined whether to perform the error control or not for the entire system, demodulation may be performed in two modes, one with the error-control supporting function and another without the error-control supporting function.

In the first embodiment, error control information, which indicates whether the error control function is used or not, is given by the MSB in the data writing region of the wireless IC tag 100 which is set to "1" for the operation with the error control and "0" for the operation without the error control. A region of the error control information is, however, not limited to the MSB of the data writing region. As far as the data indicating whether the error control is performed or not can be written into and controlled, the data can be in any bit other than MSB. In the first embodiment, since data without error control and data with error control are written into different separate regions, a code word of the error control is not configured with real data and a redundant portion added thereto. Therefore, a non-systematic code in which a data portion is not in a code word may be also used.

An example of product management in physical distribution in which the wireless IC tag communication system of the first embodiment is actually applied is shown in FIG. 4. Suppose that information relating to a product is written into a wireless IC tag in a plant 500, and the product is shipped and delivered by a transport company 510 to a shop 520. The plant 501 and the shop 520 respectively use reader/writers 501 and 522 having the error-control supporting function, while the transport company 510 uses reader/writers 511 and 512 not having the error-control supporting function.

In the plant 500, product information is written into the wireless IC tag and the wireless IC tag is attached to the product. At this time, as shown in FIG. 3, the data without error control (real data) is written into a region corresponding to "0" of MSB in the wireless IC tag 100, and data with error control (encoded data for error correction of real data) is written into a region corresponding to "1" of MSB. At the shipment from the plant 500, the reader/writer 501 of the plant 500 communicates with the wireless IC tag using the error control function to check the product information before shipping. By using the error control function, more reliable communication can be made in the plant 500, and a communication distance is increased. Moreover, there are advantages that the ratio of reading is improved, frequency of retransmission is reduced and the like, which results in reduction of communication time.

After goods arrive at the transport company 510, the reader/writer 511 checks the product information. However, since the reader/writer 511 of the transport company 510 does not support error control, the reader/writer 511 communicates with the wireless IC tag by setting the MSB "0" and without using the error control. The goods are sorted in the transport company 510 according to destinations. The reader/writer 512 checks information before the goods are shipped to the shop 520. The reader/writer 512, which also does not support error control, communicates by setting the MSB to "0" and using only the real data without error control.

The shop 520 uses the reader/writer 522 supporting the error control to communicate with the wireless IC tag by setting the MSB to "1" and using the error control function to confirm the delivered product. In the example, when a product is delivered to the shop 522 from other plant and the product has a wireless IC tag to which writing is performed by a reader/writer not supporting the error control, for example, the shop 520 confirms the delivered product using the reader/writer 522 but without using the error control function.

When the products are managed by plural reader/writers as in the above application example, the management of products can be carried out with the reader/writers even when not all the reader/writers have the error-control supporting function, because the error control function can be selectively used through the changes in the error control information (i.e., value set in the MSB) set by the reader/writer for the wireless IC tag.

Though the first embodiment exemplifies a product management system in physical distribution, the wireless IC tag communication system according to the present invention is not limited to the physical distribution and can be applied to any types of management of articles using a plurality of reader/writers. Further, the system can be applied not only to the article distributed over a plurality of traders, but to an article distributed internally by a single trader. A managed object is not limited to an article but may be a human, for example. Moreover, in the management by a single reader/writer, use/non-use of the error control function can be switched according to a condition of a communication path, importance of the managed object, available time for reading, and the like.

In the first embodiment, the data written by the computer 300 as the data with error control is encoded data for error correction of real data. The data, however, is not limited thereto and can be encoded data for error detection of real data.

Second Embodiment

Figure 5:
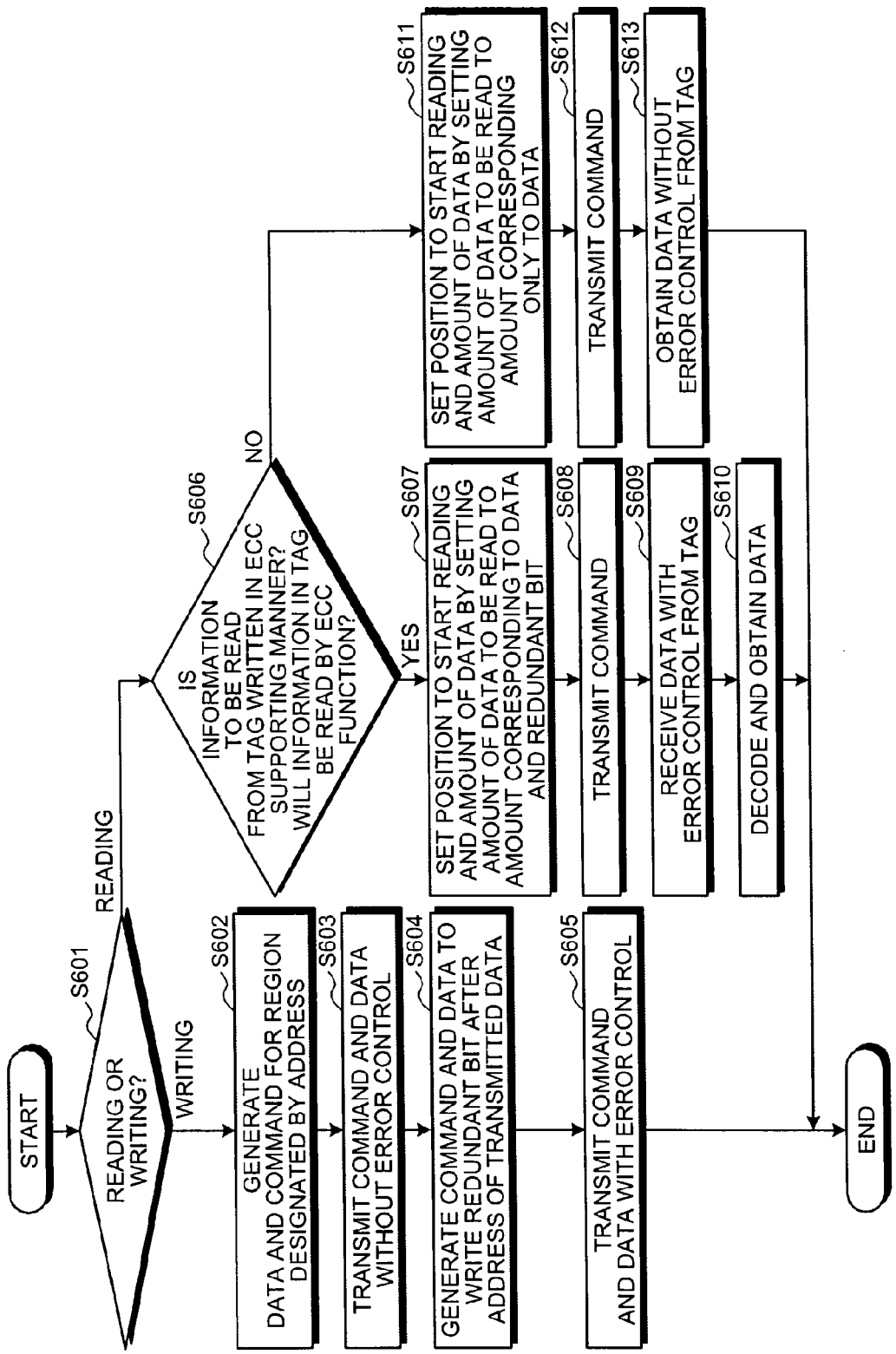
FIG. 5 is a flowchart illustrating a flow of communication between a reader/writer and a wireless IC tag showing a second embodiment of the wireless IC tag communication system according to the present invention.

FIG. 5 is a flowchart of a flow of communication between a reader/writer and a wireless IC tag of a second embodiment of the wireless IC tag communication system according to the present invention. In the second embodiment, configuration of the system is the same as that of the first embodiment shown in FIG. 1. In the second embodiment, the error control information which indicates whether the error control function is to be used or not is controlled through changes in an amount of data to be read out from the wireless IC tag 100.

Figure 6:
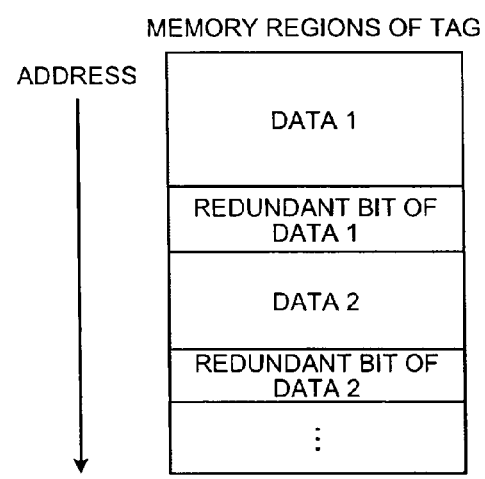
FIG. 6 is a diagram illustrating an allocation of memory regions of the wireless IC tag in the second embodiment.

At a time of data writing (step S601), a command and data are generated to write data such as an ID into the wireless IC tag 100 at a memory region designated by an address (step S602). The command and the data are transmitted after modulation (step S603). This operation is the same with an operation performed without the error control function in an existing wireless IC tag system. Subsequently, a command and data are generated to write a redundant bit of a code word which is obtained through error control coding of the data to be written into the wireless IC tag 100 (step S604). The command and the data are transmitted after modulation (step S605). As shown in FIG. 6, the redundant bit is written into a subsequent address of the data. Hence, the writing region can be efficiently used, and further, real data can be read out simply from a predetermined region at a head of the address.

When it is determined in advance whether to perform the error control or not for the entire system, since the error control function can be used at the time of data reading if information to be read from the tag is written by a reader/writer supporting the error control (step S606), an address for data reading and an amount of data to be read are set corresponding to an amount including the real data and the added redundant bit (step S607), and a command is transmitted (step S608). Then, the wireless IC tag 100 transmits the data including the real data and the added redundant bit to the reader/writer 200. The reader/writer 200 receives the data (step S609) and performs ECC decoding to obtain decoded data (step S610).

On the other hand, if the system does not need to use the error control function, the amount of data can be set to an amount corresponding only to a portion of real data (step S611), and a command can be transmitted (step S612) so that the error control function would not be used. When the reading is performed on the wireless IC tag 100 to which the information is written by a reader/writer not supporting the ECC, the amount of data is set to an amount corresponding only to a portion of the real data and a command is sent, so that information is read from the tag without using the error control function (step S613). When the error control function is not used, received signals, as they are, are transmission data from the tag.

In the second embodiment, switching control is performed to selectively use the error control function according to a command which is sent from the reader/writer 200 to the wireless IC tag 100 to designate a position to start data reading and an amount of data to be read from the wireless IC tag 100. Similar control can be realized by designating a position to stop reading instead of the data amount.

Similarly to the first embodiment, the second embodiment is extremely effective for article management using a plurality of reader/writers in physical distribution and the like as shown in FIG. 4 and for switching control for selectively using the error control function to finish reading in the shortest time depending on a condition of a communication path and the like.

Third Embodiment

Figure 7:
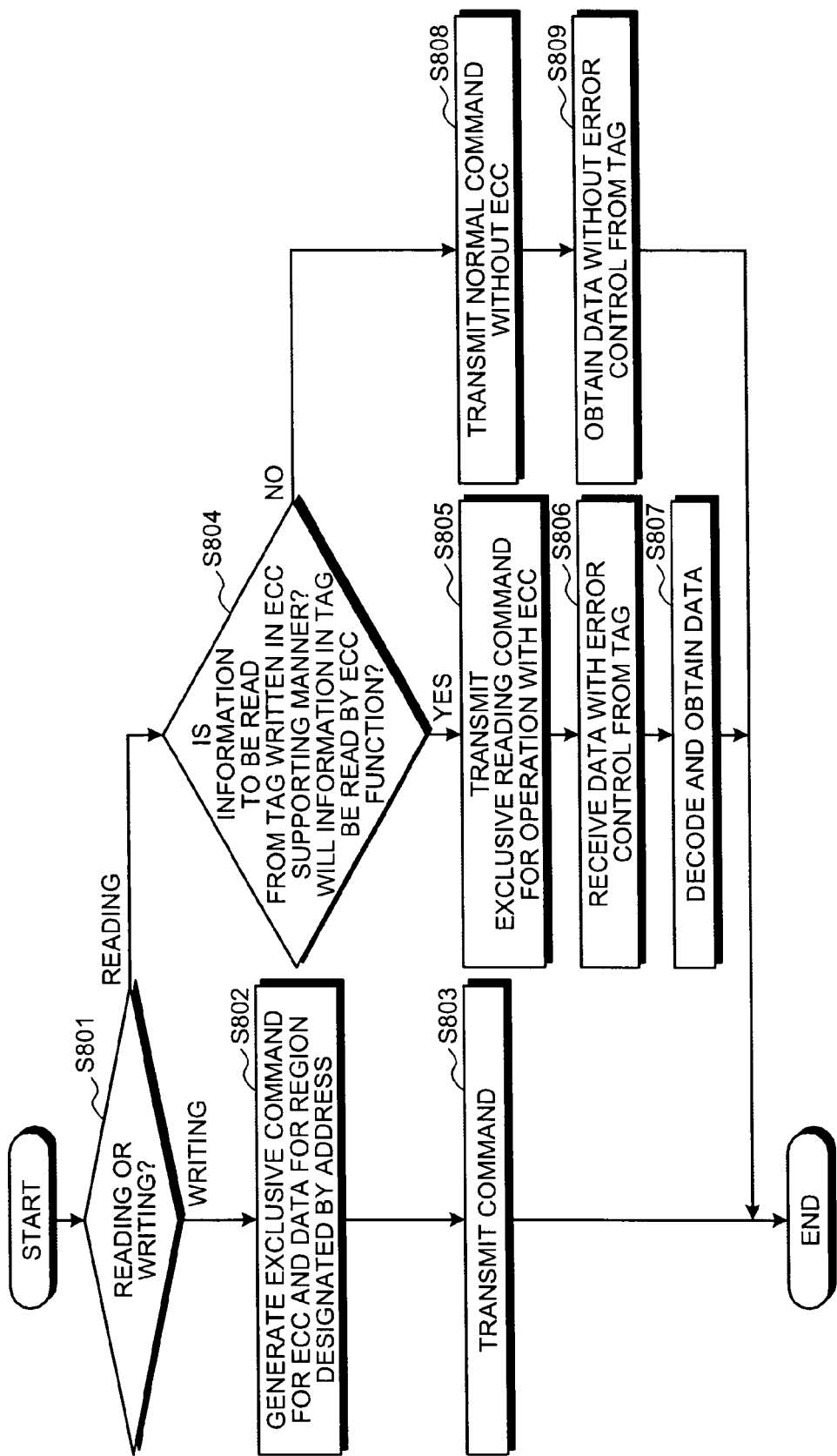
FIG. 7 is a flowchart illustrating a flow of communication between a reader/writer and a wireless IC tag showing a third embodiment of the wireless IC tag communication system according to the present invention.

FIG. 7 is a flowchart of a flow of communication between a reader/writer and a wireless IC tag of a third embodiment of the wireless IC tag communication system according to the present invention. In the third embodiment, configuration of the system is similar to that of the first embodiment shown in FIG. 1. In the third embodiment, switching on whether to use or not to use the error control function is made by allocating an exclusive writing command for operation with error control and an exclusive reading command for operation with error control to a reserve command region, which can be freely set by a user, in a command to be sent by the reader/writer to the wireless IC tag.

In FIG. 7, at the time of data writing (step S801), a command and data are generated to write data such as an ID into the wireless IC tag 100 in a memory region designated by an address (step S802) and transmitted after modulation (step S803). The writing command used here is an exclusive command for operation with error control. This is an operation similar to the operation performed in an existing RFID system not having the error control function except for a difference in command type. On receiving the exclusive command, the wireless IC tag 100 stores the data and the redundant bit in different memory regions. However, the data and the redundant bit are associated with each other in the wireless IC tag.

At the time of data reading, since the error control function can be used for the reading from the wireless IC tag for which the writing is performed by a reader/writer supporting error control (step S804), the exclusive reading command for operation with error control is transmitted (step S805). Then, the wireless IC tag transmits the data and the redundant bit associated with each other at the time of data writing to the reader/writer. The reader/writer receives the data (step S806) and performs the error control decoding to obtain the data from the tag (step S807). However, if the system does not need to use the error control function, a normal command for operation without error control can be transmitted (step S808) so that the error control function is not used. Similarly, when the writing is performed on the wireless IC tag 100 by a reader/writer having no error control function, the command for operation without error control is transmitted and the tag is read out without using the error control function (step S809). If the error control function is not used, the received signals, as they are, are the transmission data from the tag.

In the third embodiment, the exclusive command for writing the data and the redundant bit simultaneously at the time of data writing, and the exclusive command for reading out the data and the redundant bit simultaneously at the time of data reading are used. However, at the time of data writing, a normal writing command may be used for data and the exclusive command may be used only for the redundant bit. Similarly, at the time of data reading, a normal reading command may be used for data and the exclusive command may be used only for the redundant bit.

On receiving the exclusive writing command for the redundant bit, the wireless IC tag stores data, which has been received just before the reception of the exclusive writing command, and a redundant bit in different memory regions. However, the data and the redundant bit are associated with each other within the wireless IC tag. Therefore, if the exclusive reading command for the redundant bit is received in the data reading time, the wireless IC tag responds with a redundant bit corresponding to data read out in response to a normal reading command received immediately before the reception of the exclusive reading command.

Similarly to the first and the second embodiments, the third embodiment, too, is extremely effective for article management by a plurality of reader/writers in physical distribution and the like as in FIG. 4, and for controlling the use and non-use of the error control function such that the reading is finished in the shortest time depending on a condition of a communication path and the like.

Fourth Embodiment

Figures 8, 9:
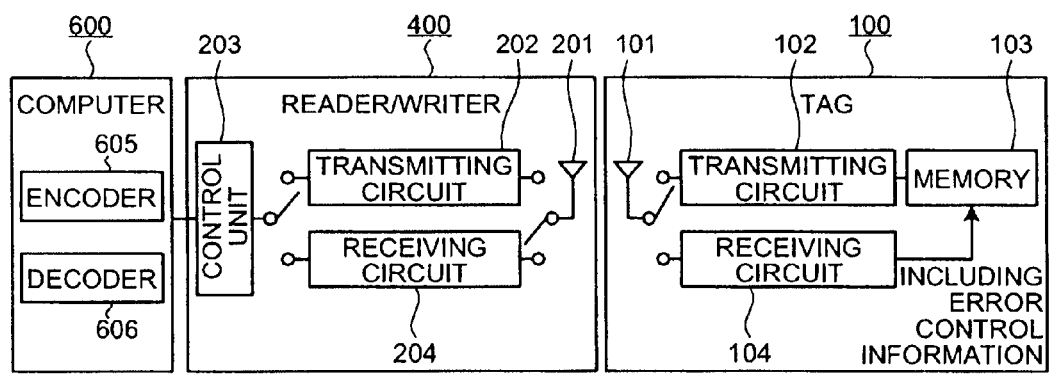
FIG. 8 is a block diagram illustrating a fourth embodiment of the wireless IC tag communication system according to the present invention.
FIG. 9 is a diagram illustrating an allocation of memory regions of a conventional wireless IC tag.

FIG. 8 is a block diagram of a fourth embodiment of the wireless IC tag communication system according to the present invention. In FIG. 8, the wireless IC tag communication system of the fourth embodiment includes the wireless IC tag 100, a reader/writer 400, and a computer 600. The reader/writer 400 does not include the error control encoder 205 and the error control decoder 206 as compared with the reader/writer 200 in the first embodiment. On the other hand, the computer 600 includes an error control encoder 605 and an error control decoder 606. In the fourth embodiment, when the error control function is used, the computer 600 carries out encoding and decoding instead of the reader/writer 400. Articles to which the wireless IC tags 100 are attached are managed through processing of information read out by the reader/writer 400.

As indicated by the configuration of the fourth embodiment, the error control encoder 205 and the error control decoder 206 can be arranged inside the computer 600, and the arranged position is not limited to the interior of the reader/writer 400.

As described above, the wireless IC tag communication system according to the present invention can manage the wireless IC tag using plural reader/writers even when not all the reader/writers possess the error control supporting function, by separately writing the real data not subjected to error control coding and data including error-control-decodable information into the wireless IC tag, and controlling the amount of read data, address, and the like based on the error control information when the reader/writer performs reading of the wireless IC tag.

Further, the wireless IC tag communication system according to the present invention can be configured without modifying an existing tag. Still further, the wireless IC tag communication system according to the present invention can realize more efficient communication by selectively using the error control function so that the reader/writer having the error control supporting function can read out the data at a fastest speed corresponding to a communication condition such as a condition of a transmission channel and a communication distance.

INDUSTRIAL APPLICABILITY

As can be seen from the foregoing, the wireless IC tag communication system according to the present invention is suitable for a system, such as a physical distribution system, for managing articles using a plurality of reader/writers, and particularly suitable for a wireless IC tag communication system which includes both a reader/writer having the error-control supporting function and a reader/writer not having the error-control supporting function or a wireless IC tag communication system which uses the error control function selectively through switching.

The invention claimed is:

1. A reader/writer that reads/writes data from/into a wireless IC tag through wireless communication, comprising:
    an error control encoder; and
    an error control decoder,
    the reader/writer, on writing data including error control information into the wireless IC tag, encoding the data by the error control encoder and separately writing real data not subjected to error control coding and data including error-control-decodable information, and, on reading data from the wireless IC tag, selecting whether to read out only the real data or to read out the data including the error-control-decodable information to decode the read out data by the error control decoder, based on the error control information indicating whether to perform error control or not.

2. The reader/writer according to claim 1, wherein the reader/writer writes real data not subjected to the error control coding and data subjected to the error control coding separately on writing data into the wireless IC tag.

3. The reader/writer according to claim 1, wherein the reader/writer writes real data not subjected to the error control coding and an error-control redundant bit of the real data separately on writing data into the wireless IC tag.

4. The reader/writer according to claim 1, wherein the reader/writer transmits the error control information to the wireless IC tag using a predetermined one bit of information to be written into the wireless IC tag.

5. The reader/writer according to claim 4, wherein the reader/writer transmits the error control information to the wireless IC tag using a most significant bit in a region to be written into the wireless IC tag.

6. The reader/writer according to claim 3, wherein the reader/writer transmits the real data and the error-control redundant bit together to the wireless IC tag using an exclusive writing command for operation with error control.

7. The reader/writer according to claim 3, wherein the reader/writer transmits the real data and the error-control redundant bit separately to the wireless IC tag using an exclusive writing command for operation with error control.

8. The reader/writer according to claim 3, wherein the reader/writer reads out the real data and the error-control redundant bit together from the wireless IC tag using an exclusive reading command for operation with error control.

9. The reader/writer according to claim 3, wherein the reader/writer reads out the real data and the error-control redundant bit separately from the wireless IC tag using an exclusive reading command for operation with error control.

10. A data processing computer that processes data read out by a reader/writer which reads/writes data from/into a wireless IC tag through wireless communication, comprising:
    an error control encoder; and
    an error control decoder,
    the computer, on writing data including error control information into the wireless IC tag, encoding the data by the error control encoder and separately writing real data not subjected to error control coding and data including error-control-decodable information, and, on reading data from the wireless IC tag, selecting whether to read out only the real data or to read out the data including the error-control-decodable information to decode the read out data by the error control decoder, based on the error control information indicating whether to perform error control or not.

11. The data processing computer according to claim 10, wherein
    the data processing computer writes real data not subjected to the error control coding and data subjected to the error control coding separately on writing data into the wireless IC tag.

12. The data processing computer according to claim 10, wherein
    the data processing computer writes real data not subjected to the error control coding and an error-control redundant bit of the real data separately on writing data into the wireless IC tag.

13. The data processing computer according to claim 10, wherein
    the data processing computer transmits the error control information to the wireless IC tag using a predetermined one bit of information to be written into the wireless IC tag.

14. The data processing computer according to claim 13, wherein
    the data processing computer transmits the error control information to the wireless IC tag using a most significant bit in a region to be written into the wireless IC tag.

15. A wireless IC tag which stores data read and written through wireless communication between the wireless IC tag and a reader/writer, wherein
    the data read and written includes real data not subjected to error control coding and data including error-control-decodable information; and
    the reader/writer, on reading data from the wireless IC tag, selects whether to read out only the real data or to read out the data including the error-control-decodable information to decode the read out data by an error control decoder, based on error control information indicating whether to perform error control or not.

16. The wireless IC tag according to claim 15, responding to the reader/writer with the error-control-decodable information by determining to perform the error-control when an amount of data is equal to or larger than a predetermined amount.

17. The wireless IC tag according to claim 15, wherein when the real data and an error-control redundant bit of the real data are written into the wireless IC tag according to an exclusive writing command for operation with error control, the wireless IC tag stores the real data and the error-control redundant bit in separate memory regions while maintaining an association therebetween.

18. The IC tag according to claim 15, wherein when the real data and an error-control redundant bit of the real data are read out from the wireless IC tag according to an exclusive reading command for operation with error control, the wireless IC tag responds with the real data and the error-control redundant bit by maintaining an association between the real data and the error-control redundant bit.

19. The wireless IC tag according to claim 15, wherein when the real data and an error-control redundant bit of the real data are written into the wireless IC tag according to an exclusive writing command for operation with error control, the wireless IC tag stores the real data written immediately before and the error-control redundant bit in separate memory regions while maintaining an association therebetween.

20. The wireless IC tag according to claim 15, wherein when the real data and an error-control redundant bit of the real data are read out from the wireless IC tag according to an exclusive reading command for operation with error control, the wireless IC tag responds with the error-control redundant bit by maintaining an association between the real data read out immediately before and the error-control redundant bit.

* * * * *